(12) United States Patent
Bredin et al.

(10) Patent No.: US 6,748,408 B1
(45) Date of Patent: Jun. 8, 2004

(54) PROGRAMMABLE NON-INTEGER FRACTIONAL DIVIDER

(75) Inventors: Francis Bredin, Maison Alfort (FR); Bertrand Gabillard, Paris (FR); Francois Auguste Roger Meunier, Mesdin (FR)

(73) Assignee: International Buisness Machines Corporation, Armonk, NY (US)

( * ) Notice: Subject to any disclaimer, the term of this patent is extended or adjusted under 35 U.S.C. 154(b) by 506 days.

(21) Appl. No.: 09/693,057

(22) Filed: Oct. 20, 2000

(30) Foreign Application Priority Data

Oct. 21, 1999 (EP) .......................................... 99480097

(51) Int. Cl.[7] .............................................. G06F 1/02
(52) U.S. Cl. .................................................... 708/271
(58) Field of Search ................................. 708/270–277, 708/103; 331/10, 16; 377/48

(56) References Cited

U.S. PATENT DOCUMENTS

| 4,241,408 | A | * | 12/1980 | Gross | 708/103 |
| 5,038,117 | A | * | 8/1991 | Miller | 331/16 |
| 5,287,296 | A | * | 2/1994 | Bays et al. | 708/103 |
| 5,371,765 | A | * | 12/1994 | Guilford | 708/651 |
| 5,761,101 | A | * | 6/1998 | Erhage | 708/276 |
| 5,999,581 | A | * | 12/1999 | Bellaouar et al. | 708/276 |
| 6,157,694 | A | * | 12/2000 | Larsson | 377/48 |
| 6,219,397 | B1 | * | 4/2001 | Park | 375/376 |
| 6,356,123 | B1 | * | 3/2002 | Lee et al. | 708/103 |
| 6,441,655 | B1 | * | 8/2002 | Fallahi et al. | 327/115 |
| 6,501,336 | B2 | * | 12/2002 | Kim et al. | 331/10 |

* cited by examiner

*Primary Examiner*—Kakali Chaki
*Assistant Examiner*—Chat Do
(74) *Attorney, Agent, or Firm*—Lawrence D. Cutter, Esq.; Kevin P. Radigan, Esq.; Heslin Rothrnberg Farley & Mesiti P.C.

(57) ABSTRACT

A non-integer fractional divider divides a reference clock signal having period P by a non-integer ratio K. The divider includes multiplexers to receive a plurality N of clock signals wherein each clock signal is equally phase shifted by a P/N delay. Incrementers coupled to the multiplexers select first and second clock signals between the N clock signals. Such that the phase shift delay between the two selected clock signals is representative of the non-integer value of K. The selected clock signals are combined to output a divided clock signal. The enabling time of each selected clock signal is respectively representative of the duration of the low level and the high level of the divided clock signal.

27 Claims, 4 Drawing Sheets

PROGRAMMABLE NON-INTEGER FRACTIONAL DIVIDER

RELATED PATENT APPLICATION

This application claims priority from European patent application number 99480097.7, filed Oct. 21, 1999, which is hereby incorporated herein by reference in its entirety.

TECHNICAL FIELD

The present invention relates to dividers, and more particularly to a programmable non-integer fractional divider.

BACKGROUND ART

Phase-locked loops (PLLs) are used in a wide variety of applications in semiconductor devices. For example, PLLs are used in clock generators, frequency multipliers, frequency synthesizers, servo systems in disk drives and more recently in wireless networks. Naturally, in all of these and other applications the accuracy and reliability of the PLL is of critical importance.

A common phase-locked loop comprises a phase comparator, a charge pump, a filter, a voltage-controlled oscillator (VCO) and a feedback divider. The general operation of PLL's is well known, so only a brief explanation will be given. The phase comparator compares a reference input signal 'Fq' from a quartz to a feedback signal from the feedback divider. Depending upon the phase difference between the input signal and feedback signal, the phase comparator drives the charge pump. The output of the charge pump is filtered by the filter, and is used to drive the VCO. The VCO comprises a voltage-to-current converter and a current controlled oscillator. Thus, the VCO receives a voltage at its input and outputs a signal with a frequency proportional to that signal. Of course, those skilled in the art will recognize that this description of the VCO is essentially arbitrary and that the VCO could be illustrated as separate voltage-to-current converter and current-controlled oscillator rather than as a single element. The output of VCO fed back through feedback divider to phase comparator. The feedback divider divides down the VCO output signal frequency 'Fvco' to match the quartz input signal frequency 'Fq' so they can be phase compared.

The frequency at which the phase-locked loop operates is dependent upon the frequency of the VCO and the amount of division by the feedback divider. To change the VCO output frequency 'Fvco', these elements must be adjusted. Typically, the frequency at the input of the feedback divider 'Fvco' is divided by an integer ratio 'N' in the way that Fout=Fvco/N, where N is the integer value.

In some circuits, to improve the granularity of the system the quartz input signal frequency 'Fq' is also divided by an integer ratio 'B' before entering the phase comparator. The two frequencies at the input of the comparator are then related according to the formula:

$$\frac{Fvco}{N} = \frac{Fq}{B}$$

which may be rewritten as:

$$Fvco = Fq \times \frac{N}{B}$$

It is readily understood that a high granularity may be obtained by increasing the value of 'B'.

Unfortunately the higher the value of 'B' is, the lower the bandwidth is. Therefore, with the known integer dividers, a tradeoff is to be found between granularity and bandwidth values.

One obvious solution to have a high bandwidth is to have a value of 'B' equal to '1', but in such case the granularity is limited to the value of Fq.

Non-integer values for 'N' are a solution for reducing the incremental performance granularity normally taken for integer ratios. However, current circuits for producing such non-integer ratios are limited to a few non-integer values. Such a prior art circuit for producing a non-integer ratio is disclosed in U.S. Pat. No. 4,891,774 from Bradley in which a dual modulus fractional divider having a dual modulus prescaler is coupled to a programmable divider. Latches and a full adder are provided for programming the programming divider with a modulus A, a modulus B, a modulus (A−1) and a modulus (B+1). A rate multiplier controls the adder to provide the desired resolution of the divider.

Therefore, there exist a need to provide an improved PLL that can operate on a wide bandwidth while having a high granularity.

The invention can be implemented in any PLL requiring a high granularity and a high frequency bandwidth, whereas, classical PLL designs allow users to trade-off between high granularity/narrow bandwidth or wide bandwidth/weak granularity. In application, the invention is suitable to operate on a bandwidth range of hundred of MHz with a granularity of hundred of kHz.

SUMMARY OF THE INVENTION

The present invention solves the foregoing need by using a VCO generating a plurality of out of phase clock signals coupled to a non-integer fractional divider. According to the present invention, the fractional divider comprises means for dividing a reference clock signal 'Fvco' having a period 'P' by a non-integer ratio 'K'. In a preferred embodiment, the divider comprises means for receiving a plurality 'N' of clock signals 'Fvco_0 to Fvco_(n−1)' issued from the reference clock signal 'Fvco', and wherein each clock signal is equally phase shifted by a 'P/N' delay one over the other. Selection means are coupled to the receiving means for selecting a first and a second clock signals between the plurality 'N' of clock signals 'Fvco_0 to Fvco_(n−1)'. The selected clock signals are such that the phase shift delay between the two selected clock signals is representative of the non-integer value of the ratio 'K'. The selected clock signals are combined into combining means responsive to the receiving means to output a divided clock signal 'Fvco/K' such that the enabling time of each selected clock signal is respectively representative of the duration of the low level and the high level of the divided clock signal. The appropriate selection of the first and second clock signals is repeated at each clock cycle according to a general formula wherein 'K' is decomposed into integer and non-integer values.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION OF THE INVENTION

Figure 1:
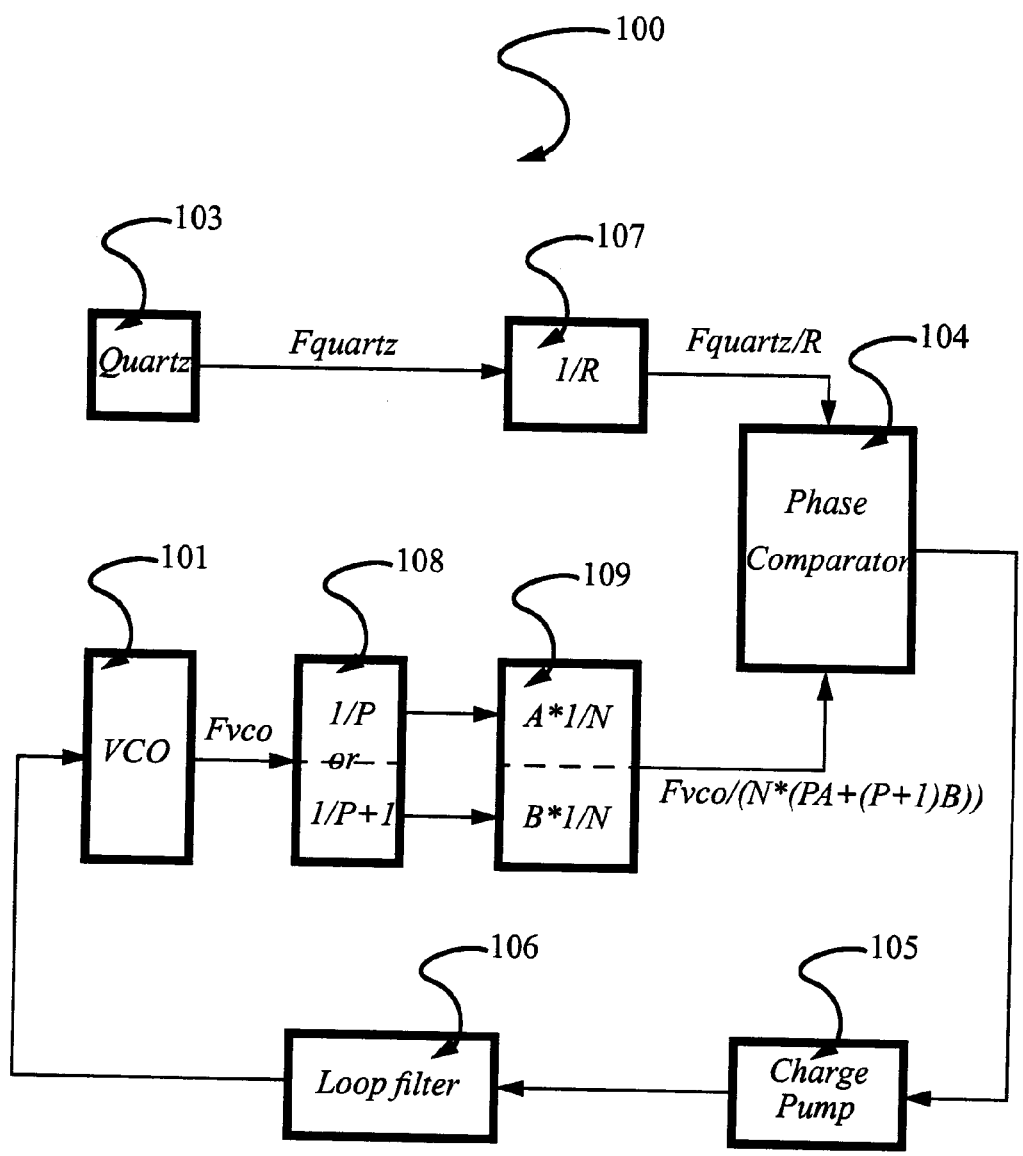
FIG. 1 illustrates a schematic block diagram of a dual modulus fractional divider.

Referring now to the drawings, and more particularly to FIG. 1 a PLL 100 using divider based on a dual modulus scheme is described. A complete description of such divider is to be found in the aforementioned patent U.S. Pat. No. 4,891,774. A VCO module 101 delivers a VCO clock 'Fvco' to a dual modulus prescaler 108. The prescaler is designed to divide the frequency of the VCO by either one of two values P or (P+1).

In practice, two counters dynamically counts a number of pulses (either A or B) before the output switches wherein A and B are constant values chosen according to the frequency of the VCO. The output of prescaler 108 is applied to a counter module 109. The frequency 'Fdiv' at the output of counter 109 is given by the equation:

$$Fdiv = \frac{Fvco}{[N \times (P \cdot A + (P+1) \cdot B)]}$$

wherein N is an integer.

A quartz module 103 gives a reference frequency 'Fq' which is later divided by a ratio 'R' within a counter 107. The frequency of the quartz signal output from the R-counter 107 is thus $$\frac{Fq}{R}.$$

The divided signal is then applied to a first input of a phase comparator 104, which also receives the output frequency 'Fdiv' of the N-counter 109. The phase comparator 104 is used to compare 'Fq/R' and 'Fdiv'. At equilibrium, the PLL circuit 100 will force the phase and the frequency of the two received signals into phase comparator 104 to be equal. A charge pump module 105 is connected to the output of the phase comparator 104, and a loop filter 106 is connected between the charge pump 105 and the VCO 101 to adjust its frequency accurately. The output frequency of the VCO is then:

$$Fvco = [N \times (P \cdot A + (P+1) \cdot B)] \cdot \frac{Fq}{R}$$

As previously stated, the minimum frequency step available is: Fq/R and such the bandwidth is limited.

Figure 2:
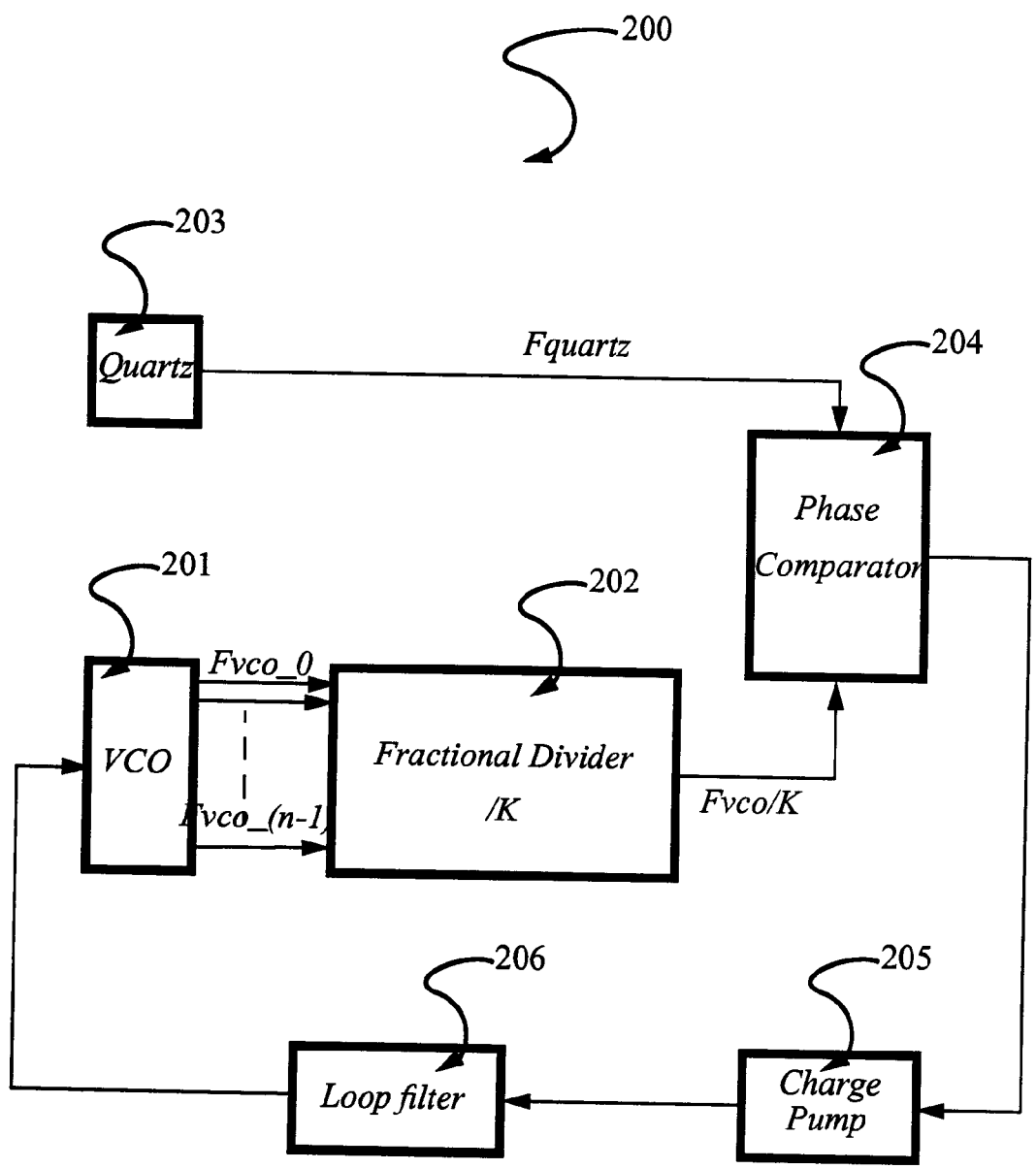
FIG. 2 illustrates a schematic block diagram of a PLL system including the fractional divider of the present invention.

Referring next to FIG. 2, there is illustrated a general representation of a PLL circuit 200 of the present invention. A VCO module delivers N clocks signals denoted 'Fvco,0' to 'Fvco,(n−1)' to a fractional divider 202. The divide ratio of divider 202 is noted as 'K' wherein K is a positive non-integer value. The frequency of the signal at the output of the fractional divider 202 is 'Fvco/K', wherein K is proportional to 1/N. The resolution of the PLL is 'Fquartz/N'.

A quartz module 203 delivers to a first input of a phase comparator 204 a reference quartz signal having a 'Fquartz' frequency. A second input of the phase comparator 204 is connected to the output of the fractional divider 202 to receive the divided frequency 'Fvco/K'. The phase comparator 204 compares the two frequencies 'Fquartz' and 'Fvco/K'.

A charge pump 205 is connected to the output of the phase comparator 204, and a loop filter 206 is connected between the charge pump 205 and the multiple outputs VCO 201 to adjust its frequency accurately.

The multiple outputs VCO circuit 201 may be implemented by means of a chain of standard inverters which delay the input signal of the VCO by a constant interval. In a preferred implementation, the phase shift between two successive outputs of the VCO is equal to 0.125 while the number of outputs is 8.

Figure 3:
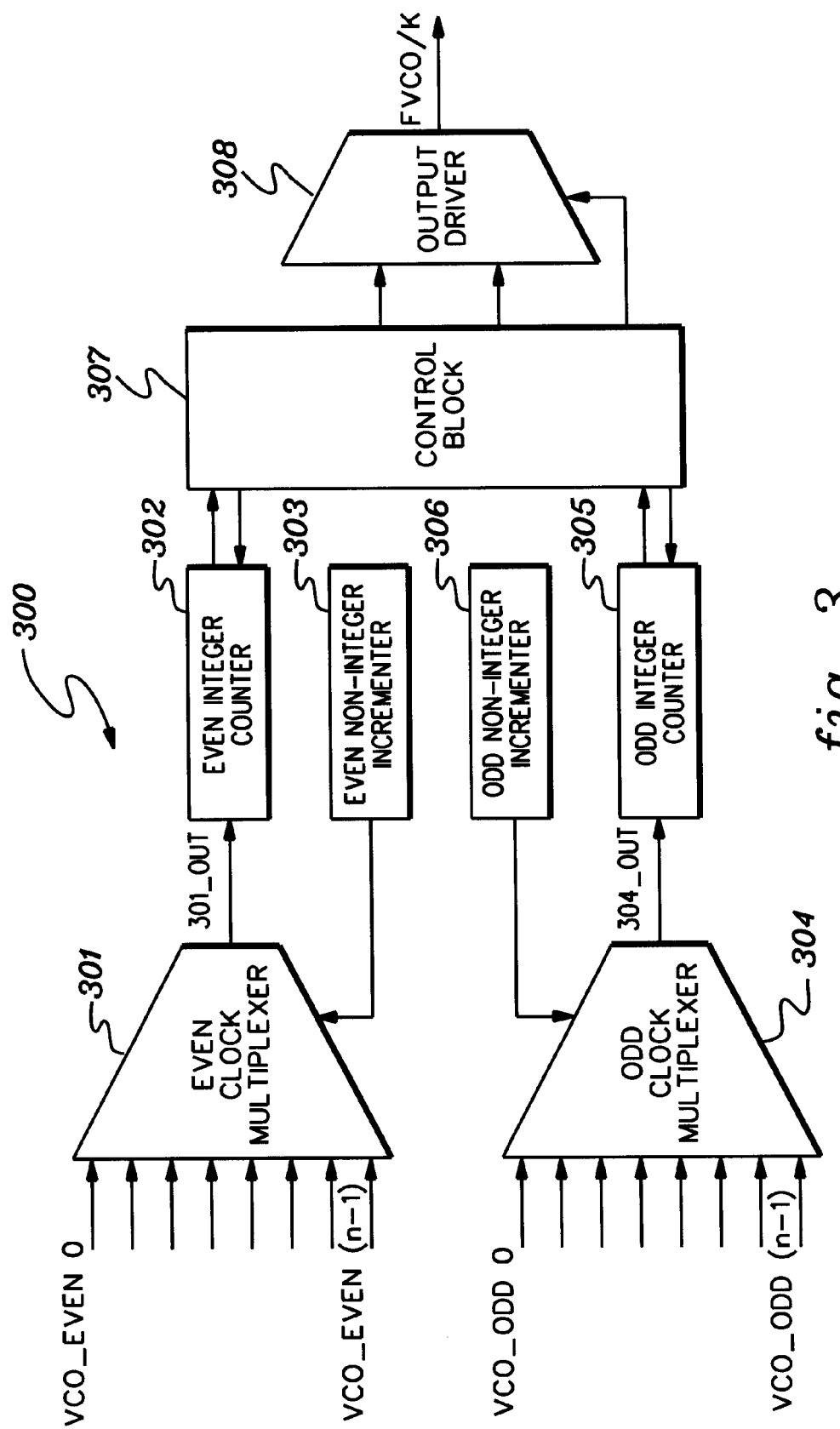
FIG. 3 illustrates a preferred embodiment of the present invention.

The non-integer fractional divider of the present invention overcomes the limitations of the prior art by providing a circuit which allows the selection of appropriate phase shifted VCO output frequencies to achieve the desired division. FIG. 3 shows a diagram setting out full details of the preferred embodiment of the fractional divider 300 of the present invention. The fractional divider 300 comprises an Even Clock Multiplexer 301, an Even Integer Counter 302, an Even Non-Integer Incrementer 303, an Odd Clock Multiplexer 304, an Odd Integer Counter 305, an Odd Non-Integer Incrementer 306, a Control block 307 and an Output Driver 308.

As previously described, the VCO delivers a plurality 'N' of VCO clocks signals, each clock signal having a period of 'P' and being phase-shifted over the previous one by a time period equal to 'P/N'. Each VCO clock signal is connected to both multiplexers (301, 304), hence each multiplexer inputs the same number 'N' of VCO clock signals. For clarity of the description, the VCO clock signals received by the Even Clock Multiplexer 301 are denoted 'Vco_even0' to 'Vco_even(n−1)' and the VCO clock signals received by the Odd Clock Multiplexer 302 are denoted 'Vco_odd0' to 'Vco_odd(n−1)', wherein the respectively ith 'Vco_eveni' clock signal is the same signal than the ith 'Vco_oddi' clock signal.

To better understand the operation of the non-integer divider, one lets consider that the divide ratio of divider 300 which is noted 'K' may be rewritten as being the sum of two values K0 and K1 according to the following equation:

$$K = K0 + K1 \quad (1)$$

wherein K0 and K1 are respectively associated to the low level time length and the high level time length of the divider output signal. The values of K0 and K1 are chosen according to the desired duty cycle. For example if a duty cycle of 50% is required, K0 is chosen to be equal to K1.

Moreover K0 and K1 can be rewritten according to the following equations:

$$K0 = I0 + X0 \text{ and } K1 = I1 + X1 \quad (2)$$

wherein I0 and I1 represent respectively the integer part of K0 and K1, whereas X0 and X1 represent respectively the non integer part of K0 and K1.

Since K is proportional to 1/N, then (K0+K1) is proportional to 1/N. Therefore X0 and X1 are proportional to 1/N and may be expressed by the following equations:

$$X0 = \frac{1}{N} \times V0 \text{ and } X1 = \frac{1}{N} \times V1 \quad (3)$$

which may be rearranged as:

$$V0 = X0 \times N \text{ and } V1 = X1 \times N \quad (4)$$

By substituting equations (3) respectively into equations (2), one obtains:

$$K0 = [I0 + (\tfrac{1}{N} \times V0)] \text{ and } K1 = [I1 + (\tfrac{1}{N} \times V1)] \quad (5)$$

Again by substituting equations (5) into equation (1):

$$K = [I0 + (\tfrac{1}{N} \times V0)] + [I1 + (\tfrac{1}{N} \times V1)] \quad (6)$$

To take an example one let's desired a divider ratio of K=5.125 with a granularity of 0.125. The number of clocks signals to be output from the VCO is then N=1/0.125=8. If a duty cycle of 61% (i.e. ratio of low level time length over high level time length) is needed for the fractional divider ratio of 5.125, K may be for example decomposed into K0=2.0 and K1=3.125 according to equation (1). With application of equations (2) and (3), one obtains: I0=2; I1=3; X0=⅛×0 and X1=⅛×0.125 which gives V0=0 and V1=1 by substitution into equations (4).

It is to be understood that this example is just for illustration and that any other decomposition of K is valid with respect to equations (1) to (6).

Generally speaking, referring again to FIG. 3, each counter (302, 305) respectively count I0 and I1 periods one after each other. The predetermined values of I0 and I1 are stored within the control block 307. Once one counter has reached its count the other one starts counting and so on. Each counter (302, 305) is clocked by the corresponding output (301_out, 304_out) of multiplexers (301, 304). The active output of each multiplexer is determined according to an algorithm implemented within the even and odd incrementers (303, 306). The alternate selection of the appropriate input (Vco_even, Vco_odd) of each mulitplexer is given by the general formulae:

On first cycle C=0:
For the Even multiplexer 301: Vco_even0=C×(V0+V1) modulo N
For the Odd multiplexer 304: Vco_odd0=C×V0+(C+1)×V1 modulo N On second cycle C=1:
For the Even multiplexer 301: Vco_even1=(C+1)×(V0+V1) modulo N
For the Odd multiplexer 304: Vco_odd1=C×V0+(C+1)×V1 modulo N And so on for the following cycles:
On last cycle C=(n−1):
For the Even multiplexer 301: Vco_even(n−1)=(C+1)×(V0+V1) modulo N
For the Odd multiplexer 304: Vco_odd(n−1)=C×V0+(C+1)×V1 modulo N The output of the active multiplexer is successively send to the output driver 308 when a corresponding enable signal (Even/Odd enable) delivered by the Control block 307 is set.

To restate, once a counter is full, the other counter starts counting after a delay which is given by the following equation:

$$countdelay = P \times \frac{(Vco\_even i - Vco\_odd) \, moduloN}{N} \quad (7)$$

To take the previous example where N=8, if 'Vco_even0' is first delivered on line '301_out' and 'Vco_odd1' is next delivered on line '304_out', the phase shift between the two counters is equal to '0.125×P' by computation of equation (7). This phase shift stands for the non-integer part of the divider.

The person skilled in the art will easily devise any configuration of time period for the multiplexers and the counters to achieve any non-integer value of the fractional divider.

The divider of the present invention is preferably designed using high level logic circuitry description such as the well-known VHDL code, but of course the preferred embodiment is not the only form in which the invention may be embodied. For example, the two multiplexers may be replaced by an interpolator-type circuitry to achieve the selection of the appropriate VCO output.

In a simplified version wherein the duty cycle is not a constraint for the application, the non-integer ratio divider of the present invention consists in having a unique counter. Essentially, the multiplexer 304, the incrementer 306 and the counter 305 are deleted, and replaced by a fixed clock.

Figure 4:
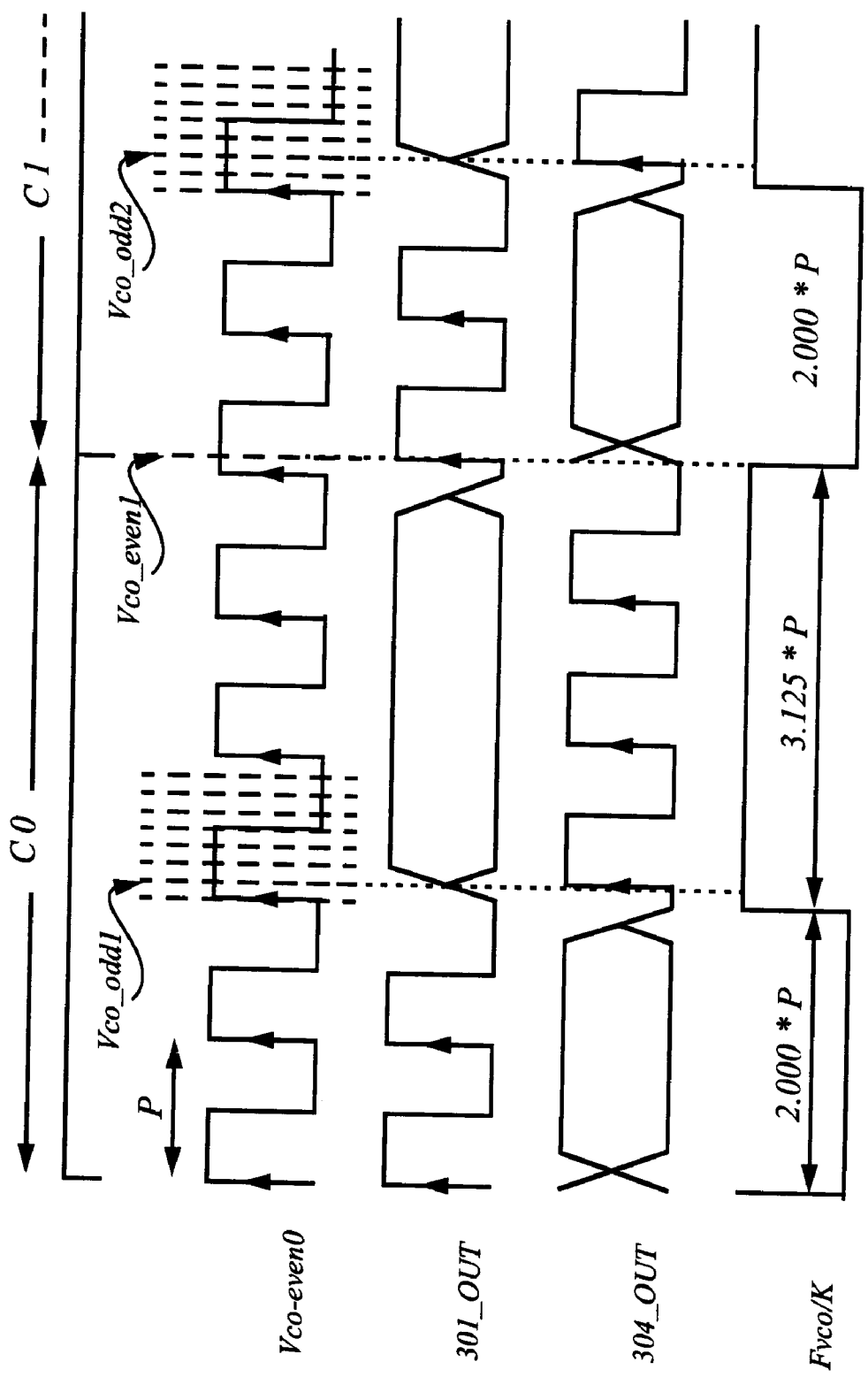
FIG. 4 illustrates a timing diagram of the operation of the fractional divider of the present invention.

Referring now to FIG. 4, a timing diagram of the operation of the fractional divider of the present invention is illustrated for the already described example where K=5.125 decomposed into K0=2 and K1=3.125 with I0=2, I1=3, V0=0 and V1=1.

On a first line, the Vco clock signal 'Vco_even0' having a period of 'P' is shown during two successive cycles (C0, C1). On a second line, the output '301_out' of the Even multiplexer 301 is shown outputting the first VCO clock signal 'Vco_even0' during two periods because I0=2, and then being disabled during the rest of the first cycle. On a third line, the output '304_out' of the Odd multiplexer 304 is shown first being disabled during the first two periods, and then being enabled during three periods, because I1=3. The Odd multiplexer 304 outputs the second VCO clock signal 'Vco_odd1' which is delayed by a 0.125 time period over the first VCO clock signal.

On a fourth line, the output of the fractional divider 'Fvco/K' shows that the low level signal times two periods while the high level signal times 3.125 periods which stands for a duty cycle of 61% as previously discussed. The phase shift of 0.125 is given by the corresponding phase shift between the first VCO output signal 'Vco_even0' and the second VCO output signal 'Vco_odd1'.

It is to be noted that the incrementation operation to determine a new VCO clock signal is computed when the counter coupled to the corresponding multiplexer is disabled in order that the new Vco clock signal be set before the next cycle.

The second cycle 'C1' on FIG. 4 shows that the output '301_out' of the Even multiplexer 301 has been incremented and positioned to the second VCO clock signal 'Vco_even1' in order that the output of the divider be switched exactly after 5.125 periods. Similarly, the output '304_out' of the Odd multiplexer 304 is incremented and positioned to the third VCO clock signal 'Vco_odd2' as shown by the vertical dashed line.

Although the present invention and its advantages have been described in detail, it should be understood that various changes, substitutions and alterations can be made herein without departing from the spirit and scope of the invention as defined by the appended claims.

What is claimed is:

1. A non-integer fractional divider for dividing a clock signal (Fvco) of period (P) by a non-integer ratio (K), comprising:
    means (301,304) for receiving a plurality (N) of clock signals (Fvco_0 to Fvco_(N−1)), each clock signal having a period of (P) and being equally phase shifted by a (P/N) delay one over the other;
    means (303,306) coupled to the receiving means for selecting a first and a second clock signals between the plurality (N) of clock signals (Fvco_0 to Fvco_(N−1));
    means (302,305,307,308) responsive to the receiving means for combining the first and the second selected clock signals and for outputting a divided clock signal (Fvco/K), wherein the phase shift delay between the two selected clock signals is representative of the non-integer value of the ratio (K) and an enabling time of each selected clock signal is respectively representative of a duration of a low level and a high level of the divided clock signal, the duration of the low level and the duration of the high level being adjustable based at least in part on an adjustable decomposition of the non-integer ratio (K) into a sum (K0+K1).

2. The non-integer fractional divider of claim 1 wherein the receiving means comprises a first multiplexer to receive the plurality (N) of clock signals (Vco_even0 to Vco_even(N−1)) and to output the first selected clock signal (301_out) in response to the selection means and a second multiplexer to receive a duplicate set (Vco_odd0 to Vco_odd(N−1)) of the plurality (N) of clock signals and to output the second selected clock signal (304_out) in response to the selection means.

3. The non-integer fractional divider of claim 2 wherein the selection means comprises a first logic circuitry (303) coupled to the first multiplexer to select a first clock signal between the plurality of clock signals (Vco_even0 to Vco_even(N−1)) and a second logic circuitry (306) coupled to the second multiplexer to select a second clock signal between the plurality of clock signals of the duplicate set (Vco_odd0 to Vco_odd(N−1)).

4. The non-integer fractional divider of claim 3 wherein the combining means comprises a first counting means (302) receiving the output of the first multiplexer to enable the first selected clock signal during a first time period (I0), and a second counting means (305) receiving the output of the second multiplexer to enable the second selected clock signal during a second time period (I1).

5. The non-integer fractional divider of claim 4 further comprising a control circuitry (307) coupled to the first and the second counting means for storing the values of the first and second time periods (I0,I1).

6. The non-integer fractional divider of claim 5 wherein the first and second time period values (I0,I1) are adjusted to integer values, and wherein the non-integer ratio (K) is proportional to said time period values according to a formula:

$$K=(I0+X0)+(I1+X1)$$

being proportional to 1/N with K0=I0+X0 and K1=I1+X1 wherein X0 and X1 represent the non-integer part of K0 and K1.

7. The non-integer fractional divider of claim 4 wherein the first and second time period values (I0,I1) are adjusted to integer values, and wherein the non-integer ratio (K) is proportional to said time period values according to a formula:

$$K=(I0+X0)+(I1+X1)$$

being proportional to 1/N with K0=I0+X0 and K1=I1+X1 wherein X0 and X1 represent the non-integer part of K0 and K1.

8. The non-integer fractional divider of claim 2 wherein the combining means comprises a first counting means (302) receiving the output of the first multiplexer to enable the first selected clock signal during a first time period (I0), and a second counting means (305) receiving the output of the second multiplexer to enable the second selected clock signal during a second time period (I1).

9. The non-integer fractional divider of claim 8 further comprising a control circuitry (307) coupled to the first and the second counting means for storing the values of the first and second time periods (I0,I1).

10. The non-integer fractional divider of claim 9 wherein the first and second time period values (I0,I1) are adjusted to integer values, and wherein the non-integer ratio (K) is proportional to said time period values according to a formula:

$$K=(I0+X0)+(I1+X1)$$

being proportional to 1/N with K0=I0+X0 and K1=I1+X1 wherein X0 and X1 represent the non-integer part of K0 and K1.

11. The non-integer fractional divider of claim 8 wherein the first and second time period values (I0,I1) are adjusted to integer values, and wherein the non-integer ratio (K) is proportional to said time period values according to a formula:

$$K=(I0+X0)+(I1+X1)$$

being proportional to 1/N with K0=I0+X0 and K1=I1+X1 wherein X0 and X1 represent the non-integer part of K0 and K1.

12. The non-integer fractional divider of claim 1 wherein the selection means comprises a first logic circuitry (303) coupled to a first multiplexer (301) to select a first clock signal between the plurality of clock signals (Vco_even0 to Vco_even(N−1)) and a second logic circuitry (306) coupled to a second multiplexer (304) to select a second clock signal between the plurality of clock signals of the duplicate set (Vco_odd0 to Vco_odd(N−1)).

13. The non-integer fractional divider of claim 12 wherein the combining means comprises a first counting means (302) receiving the output of the first multiplexer to enable the first selected clock signal during a first time period (I0), and a second counting means (305) receiving the output of the second multiplexer to enable the second selected clock signal during a second time period (I1).

14. The non-integer fractional divider of claim 13 further comprising a control circuitry (307) coupled to the first and the second counting means for storing the values of the first and second time periods (I0,I1).

15. The non-integer fractional divider of claim 14 wherein the first and second time period values (I0,I1) are adjusted to integer values, and wherein the non-integer ratio (K) is proportional to said time period values according to a formula:

$$K=(I0+X0)+(I1+X1)$$

being proportional to 1/N with K0=I0+X0 and K1=I1+X1 wherein X0 and X1 represent the non-integer part of K0 and K1.

16. The non-integer fractional divider of claim 13 wherein the first and second time period values (I0,I1) are adjusted to integer values, and wherein the non-integer ratio (K) is proportional to said time period values according to a formula:

$$K=(I0+X0)+(I1+X1)$$

being proportional to 1/N with K0=I0+X0 and K1=I1+X1 wherein X0 and X1 represent the non-integer part of K0 and K1.

17. The non-integer fractional divider of claim 1 wherein the combining means comprises a first counting means (302) receiving the output of the first multiplexer to enable the first selected clock signal during a first time period (I0), and a second counting means (305) receiving the output of the second multiplexer to enable the second selected clock signal during a second time period (I1).

18. The non-integer fractional divider of claim 17 further comprising a control circuitry (307) coupled to the first and the second counting means for storing the values of the first and second time periods (I0,I1).

19. The non-integer fractional divider of claim 18 wherein the first and second time period values (I0,I1) are adjusted to integer values, and wherein the non-integer ratio (K) is proportional to said time period values according to a formula:

$$K=(I0+X0)+(I1+X1)$$

being proportional to 1/N with K0=I0+X0 and K1=I1+X1 wherein X0 and X1 represent the non-integer part of K0 and K1.

20. The non-integer fractional divider of claim 18 wherein said first and second time period values are adjusted according to a duty cycle ratio.

21. The non-integer fractional divider of claim 17 wherein the first and second time period values (I0,I1) are adjusted to integer values, and wherein the non-integer ratio (K) is proportional to said time period values according to a formula:

$$K=(I0+X0)+(I1+X1)$$

being proportional to 1/N with K0=I0+X0 and K1=I1+X1 wherein X0 and X1 represent the non-integer part of K0 and K1.

22. The non-integer fractional divider of claim 21 wherein said first and second time period values are adjusted according to a duty cycle ratio.

23. The non-integer fractional divider of claim 17 wherein said first and second time period values are adjusted according to a duty cycle ratio.

24. The non-integer fractional divider of claim 1 wherein said first and second selected clock signals are selected at each clock cycle.

25. The non-integer fractional divider of claim 1 wherein the combining means further comprises an output multiplexer (308) to sequentially output the selected first and second selected clock signals.

26. A Phase Lock Loop circuit comprising the non-integer fractional divider of claim 1.

27. A method for dividing by a non-integer ratio (K) a clock signal (Fvco) having a period 'P', comprising the steps of:

receiving a plurality (N) of clock signals (Fvco_0 to Fvco_(N−1)), each clock signal having a period of 'P' and being equally phase shifted by a 'P/N' delay one over the other;

selecting a first and a second clock signals between the plurality (N) of clock signals (Fvco_0 to Fvco_(N−1));

combining the first and the second selected clock signals to output a divided clock signal (Fvco/K), wherein the phase shift delay between the two selected clock signals is representative of the non-integer value of the ratio (K) and an enabling time of each selected clock signal is respectively representative of a duration of a low level and a high level of the divided clock signal, the duration of the low level and the duration of the high level being adjustable based at least in part on an adjustable decomposition of the non-integer ratio (K) into a sum (K0+K1).

* * * * *

UNITED STATES PATENT AND TRADEMARK OFFICE
CERTIFICATE OF CORRECTION

PATENT NO.    : 6,748,408 B1
DATED         : June 8, 2004
INVENTOR(S)   : Bredin et al.

It is certified that error appears in the above-identified patent and that said Letters Patent is hereby corrected as shown below:

<u>Title page,</u>
Item [57], ABSTRACT,
Line 6, delete the "." after the word "signals"
Line 7, delete the word "Such" and insert -- such --

<u>Column 4,</u>
Line 54, Formula, delete "X0=1/;NxV0 and X1=1/;NxV1" and insert -- X0=1/NxV0 and X1=1/NxV1 --
Line 61, Formula, delete "K0=[I0+1/;NxV0)] and K1=[I1+1/;NxV1)]" and insert -- K0=[I0+1/NxV0)] and K1=[I1+1/NxV1)] --
Line 64, Formula, delete "K=[I0+1/;NxV0)] + [I1+1/;NxV1)]" and insert -- K=[I0+1/NxV0)] + [I1+1/NxV1)] --

Signed and Sealed this

Seventeenth Day of August, 2004

JON W. DUDAS
*Acting Director of the United States Patent and Trademark Office*